(12) United States Patent
Aoyama et al.

(10) Patent No.: US 10,043,996 B2
(45) Date of Patent: Aug. 7, 2018

(54) RESIN COMPOSITION FOR ELEMENT ENCAPSULATION FOR ORGANIC ELECTRONIC DEVICES, RESIN SHEET FOR ELEMENT ENCAPSULATION FOR ORGANIC ELECTRONIC DEVICES, ORGANIC ELECTROLUMINESCENT ELEMENT, AND IMAGE DISPLAY DEVICE

(71) Applicant: FURUKAWA ELECTRIC CO., LTD., Tokyo (JP)

(72) Inventors: Masami Aoyama, Tokyo (JP); Tetsuya Mieda, Tokyo (JP); Keiji Saito, Tokyo (JP); Kunihiko Ishiguro, Tokyo (JP); Toshimitsu Nakamura, Tokyo (JP); Naoaki Mihara, Tokyo (JP); Takumi Asanuma, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 4 days.

(21) Appl. No.: 14/868,088

(22) Filed: Sep. 28, 2015

(65) Prior Publication Data

US 2016/0020426 A1    Jan. 21, 2016

Related U.S. Application Data

(63) Continuation of application No. PCT/JP2014/055941, filed on Mar. 7, 2014.

(30) Foreign Application Priority Data

Mar. 29, 2013   (JP) .................................. 2013-070795

(51) Int. Cl.
  *H01L 51/52*   (2006.01)
  *H01L 51/00*   (2006.01)
  *C08L 65/00*   (2006.01)

(52) U.S. Cl.
  CPC .......... *H01L 51/5253* (2013.01); *C08L 65/00* (2013.01); *H01L 51/004* (2013.01); *H01L 51/005* (2013.01); *H01L 51/0097* (2013.01); *C08G 2261/3324* (2013.01); *C08G 2261/418* (2013.01)

(58) Field of Classification Search
  CPC ................................ H01L 51/52; H01L 51/00
  USPC .................................................. 524/499, 572
  See application file for complete search history.

(56) References Cited

U.S. PATENT DOCUMENTS

| 6,197,419 | B1 * | 3/2001 | Hyde ...................... C09J 7/0246 428/354 |
| 7,414,086 | B2 | 8/2008 | Kimura et al. |
| 2006/0258818 | A1 | 11/2006 | Kimura et al. |
| 2009/0026934 | A1 * | 1/2009 | Fujita ....................... C09J 7/021 313/504 |
| 2010/0068514 | A1 * | 3/2010 | Ellinger .................. C09J 153/02 428/351 |
| 2011/0048513 | A1 * | 3/2011 | Booth ..................... C09J 123/16 136/252 |
| 2013/0003389 | A1 * | 1/2013 | Moroishi ............... C08F 265/06 362/311.01 |
| 2014/0141271 | A1 | 5/2014 | Uemura et al. |

FOREIGN PATENT DOCUMENTS

| JP | 5-182759 | 7/1993 |
| JP | 10-304807 | * 11/1998 |
| JP | 2005-129520 | 5/2005 |
| JP | 2005-166265 A | 6/2005 |
| JP | 2006-70221 | 3/2006 |
| JP | 2006-272190 | 10/2006 |
| JP | 2007-197517 | 8/2007 |
| JP | 2008-056967 | 3/2008 |
| JP | 2010-080293 | 4/2010 |
| TW | 200710128 A | 3/2007 |
| WO | WO 2013/002288 A1 | 1/2013 |
| WO | WO2013/031656 | 3/2013 |
| WO | WO 2013/066597 | * 5/2013 |

OTHER PUBLICATIONS

Richard J. Lewis, Sr., Hawley's Condensed Chemical Dictionary, 1997, Van Nostrand Reinhold, 13th Ed.. p. 342.*
Office Action dated Feb. 24, 2017, in Korean Patent Application No. 10-2015-7030726 (with English-language Translation).
Notification of Reexamination dated Apr. 14, 2017, in Taiwanese Patent Application No. 103111476 (with English-language Translation).
Combined Office Action and Search Report dated Aug. 18, 2016 in Chinese Patent Application No. 201480018832.4 (with partial English translation and English translation of categories of cited documents).
Office Action dated Aug. 5, 2013 in Japanese Patent Application No. 2013-070795 with English translation.
Combined Office Action and Search Report dated Jul. 22, 2015 in Taiwanese Patent Application No. 103111476 with partial English translation and English translation of category of cited documents.
Office Action dated Oct. 30, 2015 in Taiwanese Patent Application No. 103111476 with English translation.

(Continued)

*Primary Examiner* — Deve E Valdez
(74) *Attorney, Agent, or Firm* — Oblon, McClelland, Maier & Neustadt, L.L.P.

(57) ABSTRACT

Provided are a resin composition for element encapsulation for organic electronic devices which is transparent, has excellent flexibility, water vapor barrier properties, and adhesive force, and can suppress the generation of dark spots, a resin sheet for element encapsulation for organic electronic devices, an organic electroluminescent element, and an image display device. This adhesive resin composition for element encapsulation for organic electronic devices is used to seal an element for organic electronic devices, and is characterized by containing a diene polymer and a softening agent, in which the content of the softening agent is from 5% by mass to 30% by mass of the total mass.

17 Claims, 2 Drawing Sheets

(56) References Cited

OTHER PUBLICATIONS

Second Office Action dated Mar. 21, 2017, in corresponding Chinese patent Application No. 201480018832.4 (with English-language Translation).
International Search Report dated May 14, 2014, in application No. PCT/JP2014/055941, filed on Mar. 7, 2014.

\* cited by examiner

RESIN COMPOSITION FOR ELEMENT ENCAPSULATION FOR ORGANIC ELECTRONIC DEVICES, RESIN SHEET FOR ELEMENT ENCAPSULATION FOR ORGANIC ELECTRONIC DEVICES, ORGANIC ELECTROLUMINESCENT ELEMENT, AND IMAGE DISPLAY DEVICE

TECHNICAL FIELD

The present invention relates to a resin composition for element encapsulation for organic electronic devices used to seal an element for organic electronic devices, a resin sheet for element encapsulation for organic electronic devices, an organic electroluminescent element, and an image display device.

BACKGROUND ART

In recent years, research on various organic electronic devices such as organic electroluminescent (hereinafter, may also be referred to as "organic EL") displays, organic EL lightings, organic semiconductors and organic solar cells has been actively conducted, and these devices are expected to serve as the next-generation displays that will replace liquid crystal displays (LCD's), or as the next-generation lightings that will replace light emitting diode (LED) lightings. Furthermore, since organic EL elements are such that all of the constituent elements thereof can be formed from solid materials, there is a possibility that organic EL elements may be used as flexible displays or lightings. An organic EL element has a basic configuration in which an anode layer, a light emitting layer, and a cathode layer are sequentially formed on a substrate made of glass or the like. As an electric current is passed between the anode layer and the cathode layer, the organic EL element becomes self-luminous, and light can be extracted from either side of the anode layer and the cathode layer. Therefore, a top emission mode and a bottom emission mode are available as the light emission mode of organic EL devices.

However, regarding the organic EL elements described above, if moisture, impurities and the like exist in the periphery of an element, oxidation of an electrode, oxidation decomposition of an organic material caused by heat generated when the element is driven, degeneration of an organic material, or the like occurs, and thus non-light emitting areas called dark spots are generated. When the dark spots grow to have a diameter of several ten micrometers ($\mu$m), the non-light emitting areas can be identified by visual inspection, and this leads to deterioration of visibility.

As a means for suppressing such a problem, a technique has been examined in which an organic EL element is sealed so that contact with moisture or oxygen is suppressed. For example, a technique is disclosed in which a sealing can is pasted by using a sealing material to a substrate having an organic EL element formed thereon, and a desiccant is attached to the inside of the sealing can so as to seal and dry the organic EL element, thereby preventing moisture from infiltrating to the organic EL element (for example, see Patent Document 1). However, in the method of using such a glass sealing can, there are problems in that the glass sealing can is fragile to impact and easily broken during the dropping test, and in that glass with a cavity is expensive.

In this regard, a method is considered in which an element substrate of an organic EL element and a sealing substrate such as a glass plate are pasted to each other with a sealing material interposed therebetween so as to seal the organic EL element. A sealing material using a light curable resin (for example, see Patent Document 2) and a sealing material containing an epoxy resin and an acid anhydride as main components (for example, see Patent Document 3) are disclosed. Further, a transparent sealing material which does not contain a curable resin and contains a diene polymer and a liquid softening agent as main components and which is excellent in flexibility is disclosed (for example, see Patent Document 4).

CITATION LIST

Patent Document

Patent Document 1: JP 2005-166265 A
Patent Document 2: JP 05-182759 A
Patent Document 3: JP 2006-070221 A
Patent Document 4: JP 2005-129520 A

DISCLOSURE OF THE INVENTION

Problem to be Solved by the Invention

However, when the sealing materials of Patent Documents 2 and 3 described above are used, there are problems in that flexibility is poor and application to flexible displays or lightings cannot be implemented. The sealing material in which a liquid softening agent is added in an amount equal to or more than the diene polymer as disclosed in Patent Document 4 described above has excellent flexibility but has a problem in that the water vapor barrier properties and the adhesive force are decreased. When the water vapor barrier properties are low, moisture that permeates the sealing material deteriorates the organic EL element and dark spots may be generated in some cases. In addition, when the adhesive force is low, the displacement of a substrate or the peeling-off occurs due to impact to be applied during the manufacturing process, or moisture is allowed to infiltrate from the outside through the interface between the substrate and the sealing material since the original adhesive force is insufficient, and thus there is a high possibility that dark spots are generated.

Thus, it is an object of the present invention to provide a resin composition for element encapsulation for organic electronic devices which is transparent, has excellent flexibility, water vapor barrier properties, and adhesive force, and can suppress the generation of dark spots, a resin sheet for element encapsulation for organic electronic devices, an organic electroluminescent element, and an image display device.

Means for Solving Problem

In order to solve the problems described above, the resin composition for element encapsulation for organic electronic devices according to the present invention is characterized by containing a diene polymer and a softening agent, in which the content of the softening agent is from 5% by mass to 30% by mass of the total mass.

In regard to the resin composition for element encapsulation for organic electronic devices, the softening agent is preferably formed from a compound containing a saturated hydrocarbon at a ratio of 80% or more in a repeating unit.

Furthermore, in regard to the resin composition for element encapsulation for organic electronic devices, the compound containing a saturated hydrocarbon at a ratio of 80% or more in a repeating unit is preferably a compound containing an isobutylene skeleton as a main component.

Furthermore, in regard to the resin composition for element encapsulation for organic electronic devices, the compound containing an isobutylene skeleton as a main component is preferably polybutene.

Furthermore, in regard to the resin composition for element encapsulation for organic electronic devices, a number average molecular weight of the softening agent is preferably from 300 to 3,000.

Furthermore, the resin composition for element encapsulation for organic electronic devices preferably further contains a hydrogenated cyclic olefin compound.

Furthermore, in regard to the resin composition for element encapsulation for organic electronic devices, the hydrogenated cyclic olefin compound is preferably a hydrogenated petroleum resin.

Furthermore, in regard to the resin composition for element encapsulation for organic electronic devices, the hydrogenated petroleum resin preferably includes a dicyclopentadiene structure.

Furthermore, in regard to the resin composition for element encapsulation for organic electronic devices, the diene polymer is preferably at least one selected from styrene-butadiene copolymers and hydrides thereof, styrene-isoprene copolymers and hydrides thereof, styrene-butadiene-styrene block copolymers and hydrides thereof, and styrene-isoprene-styrene block copolymers and hydrides thereof.

Furthermore, in regard to the resin composition for element encapsulation for organic electronic devices, the diene polymer is preferably at least one selected from styrene-butadiene-styrene block copolymers and hydrides thereof, and styrene-isoprene-styrene block copolymers and hydrides thereof.

Furthermore, in regard to the resin composition for element encapsulation for organic electronic devices, the diene polymer is contained at a ratio of 10 to 35% by mass of the total mass, the cyclic olefin compound is preferably contained at a ratio of 50 to 75% by mass of the total mass, and the softening agent is preferably contained at a ratio of 10 to 30% by mass of the total mass.

Furthermore, in regard to the resin composition for element encapsulation for organic electronic devices, all of the diene polymer, the cyclic olefin compound, and the softening agent are preferably hydrogenated.

Furthermore, the resin composition for element encapsulation for organic electronic devices preferably further contains a desiccant.

Furthermore, in regard to the resin composition for element encapsulation for organic electronic devices, an average value of light transmittance in a wavelength region of 400 nm to 800 nm at a thickness of 0.1 mm is preferably 85% or more.

Furthermore, in order to solve the problems described above, a resin sheet for element encapsulation for organic electronic devices according to the present invention includes at least a sealing layer formed from the resin composition for element encapsulation for organic electronic devices according to any one of the above-described items.

Furthermore, in order to solve the problems described above, an organic electroluminescent element according to the present invention is sealed by the resin composition for element encapsulation for organic electronic devices according to any one of the above-described items.

Furthermore, an image display device according to the present invention includes the organic electroluminescent element described above.

Effect of the Invention

The resin composition for element encapsulation for organic electronic devices and the resin sheet for element encapsulation for organic electronic devices according to the present invention contain a diene polymer and a softening agent, in which the content of the softening agent is from 5% by mass to 30% by mass of the total mass. Thus, the resin composition and the resin sheet according to the present invention are transparent, have excellent flexibility, water vapor barrier properties, and adhesive force, and can suppress the generation of dark spots. In addition, the organic electroluminescent element and the image display device according to the present invention are sealed by the resin composition for element encapsulation for organic electronic devices. Thus, visibility is satisfactory, flexibility is not impaired, and the generation of dark spots can be suppressed.

MODE(S) FOR CARRYING OUT THE INVENTION

Hereinafter, an embodiment of the present invention is described in detail.

Figure 1:
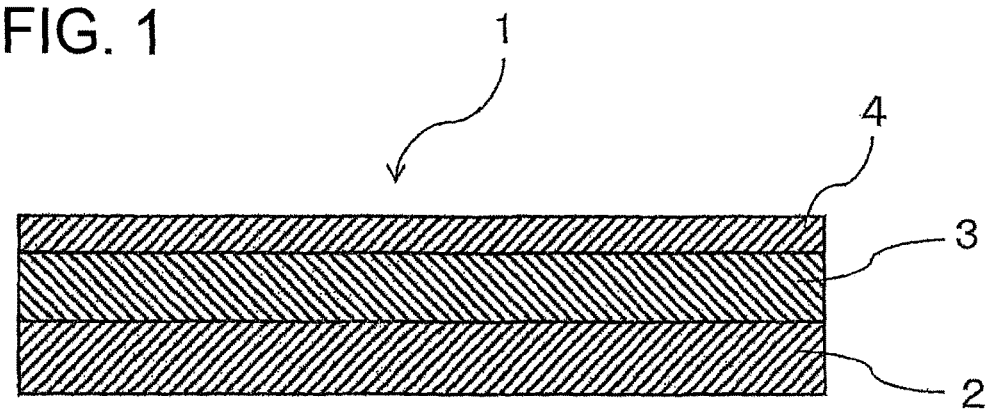
FIG. 1 is a cross-sectional view schematically illustrating the structure of a resin sheet for element encapsulation for organic electronic devices related to an embodiment of the present invention.

A resin sheet for element encapsulation for organic electronic devices 1 related to the embodiment of the present invention has at least one sealing layer 3 on at least one side of a substrate sheet 2. FIG. 1 is an outline cross-sectional view illustrating a preferred embodiment of the resin sheet for element encapsulation for organic electronic devices 1 of the present invention. As illustrated in FIG. 1, the resin sheet for element encapsulation for organic electronic devices 1 has the substrate sheet 2, and the sealing layer 3 is formed on the substrate sheet 2. Also, the resin sheet for element encapsulation for organic electronic devices 1 further includes a release film 4 for protecting the sealing layer 3, on the sealing layer 3.

Hereinafter, the various constituent elements of the resin sheet for element encapsulation for organic electronic devices 1 of the present embodiment are described in detail.

(Substrate Sheet 2 and Release Film 4)

The substrate sheet 2 is intended to temporarily fix the resin composition for the purpose of improving handleability when the resin composition that constitutes the sealing layer 3 is made into a film form. Furthermore, the release film 4 is used for the purpose of protecting the sealing layer 3.

The substrate sheet 2 and the release film 4 are not particularly limited, and examples thereof include a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate copolymer film, an ionomer resin film, an ethylene-(meth)acrylic acid copolymer film, an ethylene-(meth)acrylic ester copolymer film, a polystyrene film, a polycarbonate film, a polyimide film, and a fluororesin film. Furthermore, crosslinked films of these films are also used. Biaxially-oriented films (OPP films) can also be used. Laminate films of these films may also be used. Particularly, in view of cost, handleability and the like, it is preferable to use polyethylene terephthalate.

The peeling force required when the sealing layer 3 is peeled off from the substrate sheet 2 and the release film 4 is, for example, preferably 0.3 N/20 mm or less, and more preferably 0.2 N/20 mm. There are no particular limitations on the lower limit of the peeling force; however, a peeling force of 0.005 N/20 mm or more is practical. Furthermore, in order to improve handleability, it is preferable to use materials having peeling force different from that of the sealing layer 3 in the substrate sheet 2 and the release film 4.

The film thicknesses of the substrate sheet 2 and the release film 4 are usually 5 to 300 μm, preferably 10 to 200 μm, and particularly preferably about 20 to 100 μm.

(Sealing Layer 3)

The resin composition for element encapsulation for organic electronic devices that constitutes the sealing layer 3 contains a diene polymer and a softening agent, and the content of the softening agent is from 5% by mass to 30% by mass of the total mass.

[Diene Polymer]

As a diene polymer, a polymer formed by using a conjugated diene is preferable, a homopolymer or copolymer of a conjugated diene may be used, and a copolymer of a conjugated diene and another monomer may be used. Further, a combination of a homopolymer and a copolymer may be used. Examples of such a conjugated diene include 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, and chloroprene. Among them, 1,3-butadiene, isoprene, and 1,3-pentadiene are preferable, and 1,3-butadiene and isoprene are particularly preferable. The compounds exemplified above can be used alone or can be used in combination of two or more kinds thereof.

Examples of another monomer used for forming a copolymer include aromatic vinyl compounds such as styrene, t-butylstyrene, α-methylstyrene, α-chlorostyrene, p-methylstyrene, divinylbenzene, and N,N-diethyl-p-aminostyrene; vinyl cyanide compounds such as (meth)acrylonitrile; and nitrogen atom-containing vinyl compounds such as vinylpyridine. Among them, styrene and α-methylstyrene are suitable from the viewpoint of having a satisfactory cohesive force. The compounds exemplified above can be used alone or can be used in combination of two or more kinds thereof.

More specific examples of the diene polymer include polybutadiene, polyisoprene, a styrene-butadiene copolymer, a styrene-isoprene copolymer, an isobutylene-isoprene polymer, and an acrylonitrile-butadiene copolymer. Further, conjugated diene-based block copolymers such as a styrene-butadiene-styrene block copolymer and a styrene-isoprene-styrene block copolymer are exemplified. These diene polymers may be hydrogenated, and the degree of hydrogenation thereof is preferably 80% or more, more preferably 85% or more, and particularly preferably 90% or more. As the degree of hydrogenation increases, transparency is improved, and weather resistance can be improved. For this reason, it is possible to maintain transparency for a long period of time. Furthermore, the mass average molecular weight of the diene polymer is preferably 10,000 to 1,000,000, and more preferably 15,000 to 500,000. Incidentally, the mass average molecular weight according to the present invention is a value calculated based on a calibration curve produced by a gel permeation chromatographic (GPC) analysis, using polystyrene standard materials.

Among the diene polymers described above, copolymers consisting of a conjugated diene and an aromatic vinyl compound, and hydrides thereof are preferable; styrene-butadiene copolymers and hydrides thereof, styrene-isoprene copolymers and hydrides thereof, styrene-butadiene-styrene block copolymers and hydrides thereof, and styrene-isoprene-styrene block copolymers and hydrides thereof are more preferable; and styrene-butadiene-styrene block copolymers and hydrides thereof, and styrene-isoprene-styrene block copolymers and hydrides thereof are particularly preferable. When styrene-isoprene-styrene block copolymers and hydrides thereof, or styrene-butadiene-styrene block copolymers and hydrides thereof are contained, a cohesive force of the sealing material is high and adhesiveness is improved. In addition, by using a hydride, transparency is improved.

Regarding the copolymers of a conjugated diene and an aromatic vinyl compound, the mass average molecular weight of the aromatic vinyl compound is preferably 1,000 to 500,000, and the mass average molecular weight of the conjugated diene is preferably 15,000 to 1,000,000.

Regarding the copolymers of a conjugated diene and an aromatic vinyl compound, the aromatic vinyl compound is preferably contained in 10 mol % or more since the cohesive force may be insufficient when the aromatic vinyl compound is contained in less than 10 mol %. On the other hand, when the aromatic vinyl compound is contained in more than 40 mol %, an effect of lowering a viscosity due to the softening agent is inhibited and flexibility may be insufficient. For this reason, the aromatic vinyl compound is preferably contained in 40 mol % or less.

Examples of such copolymers of a conjugated diene and an aromatic vinyl compound include JSR TR2601 (manufactured by JSR Corporation: styrene-butadiene-styrene block copolymer), TUFTEC H1041 (manufactured by Asahi Kasei Chemicals Corp.: hydride of styrene-butadiene-styrene block copolymer), QUINTAC 3280 (manufactured by Zeon Corp.: styrene-isoprene-styrene block copolymer), SEPTON 52002 (manufactured by Kuraray Co., Ltd.: hydride of styrene-isoprene-styrene block copolymer), and SEPTON 54033 (manufactured by Kuraray Co., Ltd.: hydride of styrene-isopentadiene copolymer).

The amount of incorporation of the diene polymer is in the range of 10 to 50% by mass, and may be preferably in the range of 10 to 40% by mass, and more preferably in the range of 10 to 35% by mass relative to the total mass of the resin composition for element encapsulation for organic electronic devices. When the amount of incorporation is less than 10% by mass, the cohesive force is decreased, and thus adhesiveness is insufficient. When the amount of incorporation is more than 50% by mass, an effect of lowering a viscosity due to the softening agent is inhibited and thus flexibility is insufficient.

[Softening Agent]

Examples of the softening agent include fatty oil-based stearic acid, castor oil, palm oil, pine resin-based rosin, pine tar, petroleum-based saturated olefin aromatic products (for example, mineral oil), unsaturated olefin aromatic products (for example, naphthalene oil), naphthene oil, paraffin oil, chlorinated paraffin, coal tar-based tar, synthetic resin-based phenol-formaldehyde resins having a low degree of polymerization, low-melting-point styrene resins, low molecular polyisobutylene, polybutene, and tert-butyl phenol acethylene condensates.

Among them, a compound containing a saturated hydrocarbon at a ratio of 80% or more in a repeating unit is preferable, and for example, one or more compounds selected from the group consisting of naphthene oil, liquid paraffin, a saturated synthetic resin-based softening agent, and hydrides thereof are suitably used from the viewpoint that a sealing material with excellent weather resistance can be formed. Examples of the saturated synthetic resin-based softening agent include low-molecular polyisobutylene having a polymerization degree of about 10 to a few hundred among polyisobutylene obtained by polymerizing isobutylene alone or C4 gas containing isobutylene in the presence of Lewis acid catalyst (manufactured by BASF SE: Glissopal series or the like), polybutene having a molecular structure of long-chain hydrocarbon which is obtained by cationic polymerization of isobutene as a main part with a part of normal butene (manufactured by JX Nippon Oil & Energy Corporation: Nisseki Polybutene series; manufactured by NOF CORPORATION: EMUWET series; or the like), hydrogenated polybutene (manufactured by NOF CORPORATION: PARLEAM series), and resins obtained by hydrogenation of isoprene (manufactured by Kuraray Co., Ltd.: LIR200 series). Among them, compounds having an isobutylene skeleton are suitable from the viewpoint of having a high effect of lowering a viscosity and having satisfactory water vapor barrier properties, and polybutene is suitably used from the viewpoint of availability.

Further, the number average molecular weight of the softening agent is preferably from 300 to 50,000, more preferably from 300 to 10,000, and further preferably from 300 to 3,000. When the number average molecular weight is less than 300, the softening agent transitions to the organic EL element and dark spots are generated, which leads to deterioration of visibility. When the number average molecular weight is more than 50,000, an effect of lowering a viscosity is decreased and thus flexibility is insufficient. The molecular weight of the softening agent is, for example, in the case of polybutene, can be controlled by adjusting an amount of addition of aluminum chloride or a reaction temperature in the manufacturing method using aluminum chloride as a polymerization catalyst.

The amount of incorporation of the softening agent is in the range of 5 to 30% by mass, and may be preferably in the range of 5 to 20% by mass, and more preferably in the range of 10 to 20% by mass relative to the total mass of the resin composition for element encapsulation for organic electronic devices. When the amount of incorporation is less than 5% by mass, an effect of lowering a viscosity is decreased and thus flexibility is insufficient. When the amount of incorporation is more than 30% by mass, a cohesive force of the sealing composition is decreased and thus an adhesive force is decreased. For this reason, moisture infiltrates from the interface between the substrate and the sealing material, and thus there is a possibility that dark spots may be generated.

[Hydrogenated Cyclic Olefin Compound]

It is preferable that the resin composition for element encapsulation for organic electronic devices further contains a hydrogenated cyclic olefin compound. The hydrogenated cyclic olefin compound imparts a tack force to a diene polymer and improves an adhesive force. Further, the hydrogenated cyclic olefin compound has a function of improving water vapor barrier properties of the sealing material because of its structure. Examples of the hydrogenated cyclic olefin include a cycloolefin polymer (COP) structure and a hydrogenated tackifier. The degree of hydrogenation is preferably 80% or more, more preferably 85% or more, and particularly preferably 90% or more. As the degree of hydrogenation increases, transparency is improved and weather resistance can be improved. Accordingly, transparency can be maintained for a long period of time.

The COP structure described above typically indicates a composition having COP as a main component (that is, a component contained in an amount of more than 50% by mass). Examples of COP include hydrides of (co)polymers including, in a monomer composition, at least one compound selected from norbornene-based compounds, monocyclic olefins, cyclic conjugated dienes, and vinyl alicyclic hydrocarbons.

As a preferred example of COP, COP having at least one or more repeating units represented by the following formula (Chemical Formula 1) is exemplified. As another preferred example, COP having at least one or more repeating units represented by the following formula (Chemical Formula 2) is exemplified.

[Chemical Formula 1]

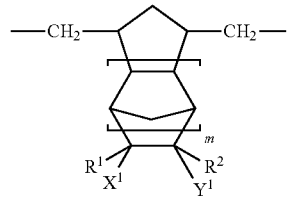

[Chemical Formula 2]

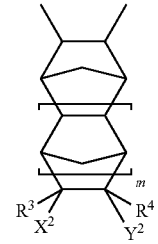

In the formulas (Chemical Formula 1) and (Chemical Formula 2), m represents an integer of 0 to 4, and is typically 1. $R^1$ to $R^4$ each independently represent a hydrogen atom or a hydrocarbon group with 1 to 10 carbon atoms (preferably 1 to 6, for example, 1 to 3) (for example, an alkyl group). Preferably, $R^1$ to $R^4$ each independently represent a hydrogen atom, a halogen atom (for example, Cl), or a methyl group.

In the above formulas (Chemical Formula 1) and (Chemical Formula 2), $X^1$, $X^2$, $Y^1$, and $Y^2$ each independently represent a hydrogen atom, a hydrocarbon group with 1 to 10 carbon atoms (preferably 1 to 6, for example, 1 to 3) (for example, an alkyl group), a halogen atom, a halogenated hydrocarbon group with 1 to 10 carbon atoms (preferably 1 to 6, for example, 1 to 3) (for example, a halogenated alkyl group), and —$(CH_2)_n COOR^{11}$ or —$(CH_2)_n OCOR^{12}$ (wherein $R^{11}$ and $R^{12}$ represent a hydrogen atom or a hydrocarbon group with 1 to 10 carbon atoms (preferably 1 to 6, for example, 1 to 3) (for example, an alkyl group), n is an integer of 0 to 10 (for example, an integer of 0 to 3, preferably 0 or 1, and typically 0)). Preferably, $X^1$, $X^2$, $Y^1$, and $Y^2$ each independently represent a hydrogen atom, a halogen atom (for example, Cl), or —COOR$^{11}$ ($R^{11}$ is a hydrogen atom or an alkyl group with 1 to 3 carbon atoms (for example, 1)).

In a preferred embodiment, the cycloolefin polymer may be a norbornene polymer obtained by (co)polymerization of norbornene monomers having a —COOR group (R represents a hydrogen atom or an alkyl group with 1 to 6 carbon atoms). As a typical example of such a norbornene polymer, a polymer having a repeating unit in which m is 1, and in the above formula (Chemical Formula 1), $R^1$ represents an alkyl group with 1 to 3 carbon atoms (for example, a methyl group), $X^1$ is —COOR$^{11}$ ($R^{11}$ represents a hydrogen atom or an alkyl group with 1 to 3 carbon atoms (for example, a methyl group)), both of $R^2$ and $Y^1$ represent a hydrogen atom, is exemplified.

As COP, it is possible to employ COP having repeating units represented by the above formulas (Chemical Formula 1) and (Chemical Formula 2) in 50% by mass or more, preferably 70% by mass or more, and more preferably 90% by mass or more. Alternatively, COP substantially constituted by repeating units represented by the above formulas (Chemical Formula 1) and (Chemical Formula 2) may be used. Such COP can be produced by (co)polymerizing, according to an ordinary method, monomers having a structure forming repeating units represented by the above formulas (Chemical Formula 1) and (Chemical Formula 2), for example, by ring-opening polymerization and hydrogenation. Examples of a monomer which can be copolymerized with the monomers having a structure forming repeating units represented by the above formulas (Chemical Formula 1) and (Chemical Formula 2), include olefins such as ethylene and propylene; vinyl compounds (compounds having a vinyl group) such as vinyl acetate and vinyl chloride; and compounds having an acryloyl group or a methacryloyl group such as acrylic acid, methacryl acid, and esters thereof (for example, alkyl ester of methyl methacrylate or the like).

Examples of such COP include TOPAS (registered trademark) (manufactured by TOPAS Advanced Polymers), APEL (registered trademark) (manufactured by Mitsui Chemicals Inc.), ZEONEX (registered trademark) (manufactured by Zeon Corp.), ZEONOR (registered trademark) (manufactured by Zeon Corp.), and ARTON (registered trademark) (manufactured by JSR Corporation).

Examples of the hydrogenated tackifier include hydrogenated petroleum resins, hydrogenated rosin-based resins, and hydrogenated terpene-based resins. Among them, the hydrogenated petroleum resin is suitably used from the viewpoint of having satisfactory water vapor barrier properties. Examples of such a hydrogenated petroleum resin include hydrogenated dicyclopentadiene-based petroleum resins (manufactured by Tonex Co., Ltd.: Escorez 5300 and 5400 series; manufactured by Eastman Chemical Company: Eastotac H series; and the like) that are C5-based hydrogenated petroleum resins obtainable by copolymerizing a C5 fraction such as pentene, isoprene, piperine, or 1,3-pentadiene, to be formed by thermal cracking of petroleum naphtha; partially-hydrogenated aromatic-modified dicyclopentadiene-based petroleum resins (manufactured by Tonex Co., Ltd.: Escorez 5600 series and the like); hydrogenated aromatic petroleum resins (manufactured by Arakawa Chemical Industries, Ltd.: ARKON P or M series) obtainable by copolymerizing a C9 fraction such as indene, vinyltoluene, or α- or β-methylstyrene, to be formed by thermal cracking of petroleum naphtha; and hydrogenated dicyclopentadiene/aromatic copolymer-based petroleum resins of the C5 fraction and the C9 fraction described above (manufactured by Idemitsu Kosan Co., Ltd.: I-MARV series). Among them, hydrogenated petroleum resins containing a dicyclopentadiene structure are suitably used from the viewpoint of having satisfactory water vapor barrier properties due to the rigid structure.

The hydrogenated cyclic olefin compounds exemplified above can be used alone or can be used in combination of two or more kinds thereof. When the COP structure is employed, the water vapor barrier properties are easily improved. When the hydrogenated tackifier is employed, a tack force can be imparted greatly and the adhesiveness is easily improved. In consideration of the balance between the water vapor barrier properties and the adhesiveness, hydrogenated petroleum resins having a dicyclopentadiene structure are suitably used.

The amount of incorporation of the hydrogenated cyclic olefin compound is in the range of 30 to 75% by mass, preferably in the range of 40 to 75% by mass, and more preferably in the range of 50 to 75% by mass relative to the total mass of the resin composition for element encapsulation for organic electronic devices. When the amount of incorporation is less than 30% by mass, the tack force and the water vapor barrier properties are insufficient. When the amount of incorporation is more than 75% by mass, an effect of lowering a viscosity due to the softening agent is inhibited and thus the flexibility is insufficient.

[Desiccant]

It is preferable that the resin composition for element encapsulation for organic electronic devices further contains a desiccant. The desiccant is used for the purpose of capturing the moisture that permeates the resin composition. By capturing moisture, moisture-induced deterioration of the organic EL element 6 (see FIGS. 2 and 3) can be suppressed. The desiccant may be a metal oxide desiccant or an organic desiccant, and is not particularly limited. For example, powdery inorganic oxides such as barium oxide (BaO), calcium oxide (CaO), strontium oxide (SrO), and magnesium oxide (MgO) can be used as well as an organic compound that is known as a transparent moisture getter agent. Further, these desiccants can be used alone or can be used as mixtures of two or more kinds thereof.

A metal oxide-based desiccant is usually added as a powder. The average particle diameter of the desiccant may be usually in the range of less than 20 μm, and is preferably 10 μm or less, and more preferably 1 μm or less. In a case in which the resin composition for element encapsulation for organic electronic devices is made into a film to form the sealing layer 3, the metal oxide-based desiccant should be made sufficiently smaller than the film thickness. When the particle diameter is adjusted as such, the possibility of damaging the organic EL element 6 is reduced, and the desiccant particles do not interrupt image recognition. Incidentally, when the average particle diameter is less than 0.01 μm, the production cost may increase in order to prevent scattering of the desiccant particles.

The organic compound may be any material which takes in water by a chemical reaction and is not opacified before and after the reaction. Particularly, an organometallic compound is suitably due to the desiccating ability. The organometallic compound according to the present invention is defined as a compound having a metal-carbon bond, a metal-oxygen bond, a metal-nitrogen bond, or the like.

When water and an organometallic compound react with each other, the bonds described above are broken by a hydrolysis reaction, and a metal hydroxide is obtained. Depending on kinds of metal, the metal hydroxide may be subjected to hydrolytic polycondensation after the reaction to have a high-molecular-weight state.

Preferred examples of the organometallic compound in the present invention include metal alkoxides, metal carboxylates, and metal chelates. Regarding the metal, any organometallic compound having high reactivity with water, that is, a metal atom with which the various bonds with metal described above are prone to be broken by water, may be used. Specific examples thereof include aluminum, silicon, titanium, zirconium, silicon, bismuth, strontium, calcium, copper, sodium, and lithium. In addition, examples thereof include cesium, magnesium, barium, vanadium, niobium, chromium, tantalum, tungsten, chromium, indium, and iron. In particular, a desiccant of an organometallic compound having aluminum as the central metal is suitable from the viewpoints of dispersibility in the resin and reactivity with water. Examples of the organic group include alkoxy groups and carboxyl groups containing unsaturated hydrocarbons, saturated hydrocarbons, branched unsaturated hydrocarbons, branched saturated hydrocarbons, and cyclic hydrocarbons, such as a methoxy group, an ethoxy group, a propoxy group, a butoxy group, a 2-ethylhexyl group, an octyl group, a decyl group, a hexyl group, an octadecyl group, and a stearyl group; and β-diketonato groups such as an acetylacetonato group and a dipivaloylmethanato group.

Among them, aluminum ethyl acetoacetate with 1 to 8 carbon atoms represented by the following formula (Chemical Formula 3) is suitably used from the viewpoint of being capable of forming a sealing composition having excellent transparency.

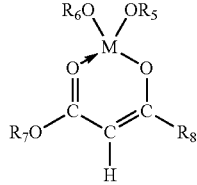

[Chemical Formula 3]

wherein $R_5$ to $R_8$ represent organic groups having from 1 to 8 carbon atoms including an alkyl group, an aryl group, an alkoxy group, a cycloalkyl group, and an acyl group; M represents a trivalent metal atom; and $R_5$ to $R_8$ may be respectively identical organic groups or different organic groups.

The aluminum ethyl acetoacetate with 1 to 8 carbon atoms is commercially available from, for example, Kawaken Fine Chemicals Co., Ltd. and Hope Chemicals Co., Ltd.

The amount of addition of the desiccant is preferably 0.05 to 10% by mass and more preferably 1 to 5% by mass relative to the total amount of the resin composition for element encapsulation for organic electronic devices. When the amount of addition exceeds 10% by mass, the desiccant captures the moisture that permeates the sealing composition and actively absorbs the moisture. Accordingly, water vapor barrier properties are deteriorated.

[Other Additives]

Further, the resin composition for element encapsulation for organic electronic devices may also contain a filler. Examples of the filler may include salts of calcium carbonate and magnesium carbonate such as calcium carbonate, magnesium carbonate, and dolomite; salts of silicate such as kaolin, calcined clay, pyrophyllite, bentonite, sericite, zeolite, talc, attapulgite, and wollastonite; silicate such as diatom earth and silica powder; aluminum hydroxide; palite; barium sulfate such as precipitated barium sulfate; calcium sulfate such as gypsum; calcium sulfite; carbon black; zinc oxide; and titanium dioxide.

Regarding these fillers, for example, in a case in which the decrease in transparency of the sealing material due to scattering of light is considered, an average primary particle diameter of the filler is preferably 1 to 100 nm and further preferably 5 to 50 nm. Further, in a case in which a plate-shaped or flake-shaped filler is used for the purpose of further improving low moisture permeability, the average primary particle diameter is preferably 0.1 to 5 µm. Furthermore, from the viewpoint of dispersibility in the resin, a filler in which the surface of a hydrophilic filler is subjected to hydrophobization treatment is suitably used. Examples of the hydrophobic filler include products obtained in such a manner that the surface of a general hydrophilic filler is treated using alkyl-based, aryl-based, and aralkyl-based silane coupling agents having a hydrophobic group such as n-octyltrialkoxysilane, silylating agents such as dimethyldichlorosilane and hexamethyldisilazane, polydimethylsiloxane having a hydroxyl group at its terminal, higher alcohols such as stearyl alcohol, or higher fatty acids such as stearic acid.

The filler may be used alone or two or more kinds thereof may be used in combination. The amount of addition of the filler when the filler is added is preferably 0.01 to 20% by mass based on the total amount of the resin composition for element encapsulation for organic electronic devices.

Further, the resin composition for element encapsulation for organic electronic devices may contain an ultraviolet absorber. Examples of the ultraviolet absorber may include a benzotriazole-based compound, an oxazolic acid amide-based compound, and a benzophenone-based compound. The amount of addition of the ultraviolet absorber when the ultraviolet absorber is added can usually be in the range of 0.01 to 3% by mass relative to the total mass of the resin composition for element encapsulation for organic electronic devices.

Further, the resin composition for element encapsulation for organic electronic devices may contain an ultraviolet light stabilizer. Examples of the ultraviolet light stabilizer may include a hindered amine-based compound. The amount of addition of the ultraviolet light stabilizer when the ultraviolet light stabilizer is added can usually be in the range of 0.01 to 3% by mass relative to the total mass of the resin composition for element encapsulation for organic electronic devices.

Further, the resin composition for element encapsulation for organic electronic devices may contain an oxidation inhibitor. Examples of the oxidation inhibitor may include a hindered phenol-based compound and a phosphate ester-based compound. The amount of addition of the oxidation inhibitor when the oxidation inhibitor is added can usually be in the range of 0.01 to 2% by mass relative to the total mass of the resin composition for element encapsulation for organic electronic devices.

Further, the resin composition for element encapsulation for organic electronic devices may contain a resin stabilizer. Examples of the resin stabilizer may include a phenol-based resin stabilizer, a hindered amine-based resin stabilizer, an imidazole-based resin stabilizer, a dithiocarbamate-based resin stabilizer, a phosphorus-based resin stabilizer, and a sulfur ester-based resin stabilizer.

The moisture transmittance of the resin composition for element encapsulation for organic electronic devices at 40° C. and 90% RH is preferably 50 g/m$^2$·day or less. The moisture transmittance thereof is more preferably 40 g/m$^2$·day or less, and particularly preferably 25 g/m$^2$·day or less. There is no limitation on the preferred lower limit value, and as the moisture transmittance becomes lower, it is possible to prevent the moisture from infiltrating from the outside. Meanwhile, in the case of a resin-based sealing material, the lower limit value is considered to be about 1 g/m$^2$·day. When the moisture transmittance is 50 g/m$^2$·day or less, it is possible to prevent the moisture from infiltrating from the outside and thus the dark spots of the organic EL element 6 can be suppressed. On the other hand, when the moisture transmittance is more than 50 g/m$^2$·day, it is not possible to prevent the moisture from infiltrating and thus the dark spots of the organic EL element 6 are induced. The moisture transmittance can be decreased by increasing the amount of addition of hydrogenated cyclic olefin or increasing the degree of hydrogenation of the resin composition for element encapsulation for organic electronic devices.

The resin composition for element encapsulation for organic electronic devices preferably has an adhesive force of 10 N/25 mm or more. The adhesive force is more preferably 15 N/25 mm or more, and particularly preferably 20 N/25 mm or more. When the adhesive force is 10 N/25 mm or more, the peeling-off from the element substrate 5 (see FIGS. 2 and 3D) of the organic EL element 6 or the sealing substrate 8 (see FIGS. 2 and 3B-3D) does not occur. Therefore, it is possible to prevent the moisture from infiltrating from the interface. On the other hand, when the adhesive force is less than 10 N/25 mm, the substrate is displaced or the peeling-off from the element substrate 5 (see FIGS. 2 and 3D) of the organic EL element 6 or the sealing substrate 8 (see FIGS. 2 and 3B-3D) occurs. Accordingly, it is not possible to prevent the moisture from infiltrating from the interface and thus the dark spots of the organic EL element 6 are induced. The adhesive force is influenced by the tack force, the flexibility, and the cohesive force, and how the adhesive force is expressed varies depending on an adherend. However, regarding a glass substrate generally used for organic EL devices, it is found that the tack force can be improved by increasing the amount of addition of hydrogenated cyclic olefin, the flexibility can be improved by increasing the amount of addition of the softening agent, and the cohesive force can be improved by increasing the amount of addition of the diene polymer. Therefore, in the present invention, when the blending ratio of each component is adjusted, it is possible to control a value to a preferable value.

It is preferable that the resin composition for element encapsulation for organic electronic devices is transparent in the visible region at a thickness of 0.1 mm. In order for the resin composition to be transparent in the visible region, it is preferable that the resin composition has an average value of light transmittance of 85% or more in a wavelength region of 400 nm to 800 nm at a thickness of 0.1 mm. When the light transmittance is less than 85%, in a case in which the resin composition is applied to sealing of top-emission-mode organic EL devices, visibility is significantly decreased. In the present invention, the light transmittance can be enhanced by increasing the degree of hydrogenation of the resin.

It is preferable that the resin composition for element encapsulation for organic electronic devices has a small amount of extrusion from a substrate. Specifically, the amount of extrusion from a substrate obtained when the resin composition is disposed between substrates, is pressed at 80° C. and a pressure of 0.6 MPa for 1 minute, and then is observed by an optical microscope, is preferably less than 10 times and more preferably less than 5 times the thickness of the resin composition for element encapsulation for organic electronic devices. Here, the amount of extrusion indicates the maximum value of the length of the sealing layer 3 extruding from each side of the substrate in a direction perpendicular to each side of the substrate. When the amount of extrusion is 10 times or more the thickness, uniformity of the thickness of the resin composition for element encapsulation for organic electronic devices is deteriorated, and the distance between the substrates is not maintained constantly. Therefore, there are cases in which the distortion occurs in the substrate and visibility is significantly decreased. The extrusion can be suppressed in such a manner that the circumference of the resin composition for element encapsulation for organic electronic devices is covered in a dam shape by applying a curable resin composition to the circumference of the resin composition for element encapsulation for organic electronic devices (sealing layer 3) during sealing and drying the curable resin composition or by providing a casing body as in FIG. 1 of Patent Document 4 described above. Further, in the present invention, even when a dam-shaped structure is not provided, the amount of extrusion can be decreased by increasing the amount of incorporation of hydrogenated cyclic olefin.

The resin composition for element encapsulation for organic electronic devices may include a solvent when a film-like sealing layer 3 is obtained. As such a solvent, toluene, methyl ethyl ketone (MEK), ethyl acetate, dimethylacetamide, N-methyl-2-pyrrolidone, a mixed solution thereof, or the like can be suitably used. The individual materials included in the resin composition are mixed and dispersed in such a solvent, and a resin solution thus obtained is applied on the release surface of a substrate sheet 2 directly or by transfer according to a generally known method such as a roll coating method, a gravure coating method, a reverse coating method, a spray coating method, an air knife coating method, a curtain coating method, a die coating method, or a comma coating method, and dried. Thus, a sealing layer 3 can be obtained.

Furthermore, regarding a technique for obtaining a film-like sealing layer 3 without using an organic solvent, the sealing layer 3 can be obtained by melting the resin composition for element encapsulation for organic electronic devices at a high temperature, extruding the composition by a generally known technique such as a hot melt coater, and then cooling the resin composition.

The thickness of the sealing layer 3 is usually 10 to 100 μm, and preferably 10 to 40 μm. When the thickness is less than 10 μm, the adhesive force relative to the element substrate 5 or the sealing substrate 8 is insufficient. Accordingly, moisture may infiltrate from the interface in some cases. When the thickness is more than 100 μm, since the end surface, which is exposed to air after sealing, of the sealing layer 3 (a surface where the sealing layer is not brought into contact with the element substrate 5 and the sealing substrate 8) is enlarged, the amount of water absorption at the end surface is increased, and thus the water vapor barrier properties are deteriorated.

Furthermore, it is more preferable that the surface roughness Ra of the sealing layer 3 and the object of pasting to be brought into contact with the sealing layer 3, is 2 μm or less.

If this surface roughness is more than 2 μm, even if the conformity of the resin composition for element encapsulation for organic electronic devices itself is high, the possibility that the sealing layer 3 may not conform to the surface of the object of pasting is increased. For this reason, when the surface roughness is in an appropriate range, the sealing layer 3 and the object of pasting are closely adhered, and therefore, visibility is enhanced. The surface roughness of the object of pasting can be changed by polishing or surface treatment, and the surface roughness of the sealing layer 3 can be modified by changing the surface roughness of the cooling roll when the sealing layer is formed into a film form, or by changing the surface roughness of the release film 4.

The resin sheet for element encapsulation for organic electronic devices 1 may include two or more sealing layers 3, and may have a layer other than the sealing layer 3. As the layer other than the sealing layer 3, for example, a gas barrier film, a glass plate, a metal plate, a metal foil or the like may be pasted by compression to the surface of the sealing layer 3 on the opposite side of the substrate sheet 1 (surface on the reverse side of the surface that is pasted to the element for organic electronic devices). In this case, the release film 4 may not be provided.

Incidentally, in order to maintain sealing performance of the sealing layer 3, it is preferable that the sealing layer 3 is stored while being enclosed with a desiccant such as silica gel, calcium oxide, or calcium chloride. Specifically, when the moisture content of the sealing layer 3 as determined by the Karl Fischer method is maintained to 0 to 0.2% by mass, it is possible to delay the deterioration of the organic electronic device sealed by the sealing layer 3.

<Method of Use>

Next, the method of using the resin sheet for element encapsulation for organic electronic devices 1 is described.

The resin sheet for element encapsulation for organic electronic devices 1 of the present invention is disposed between an organic EL element 6 and a sealing substrate 8 (see FIGS. 2 and 3B-3D) that are provided on an element substrate 5 (see FIGS. 2 and 3D), and is used to obtain various organic electronic devices having a solid cohesively encapsulated structure by encapsulating the organic EL element 6 in an air-tight manner with the element substrate 5 and the sealing substrate 8. Examples of the organic electronic devices include organic EL displays, organic EL lightings, organic semiconductors, and organic solar cells.

Hereinafter, an organic EL display (image display device) is described as an example of the organic electronic device. In the organic EL display 10, as illustrated in FIG. 2, the organic EL element 6 provided on the element substrate 5 is sealed by the sealing substrate 8, with a transparent resin layer for organic EL element encapsulation 7 being interposed therebetween.

Figure 2:
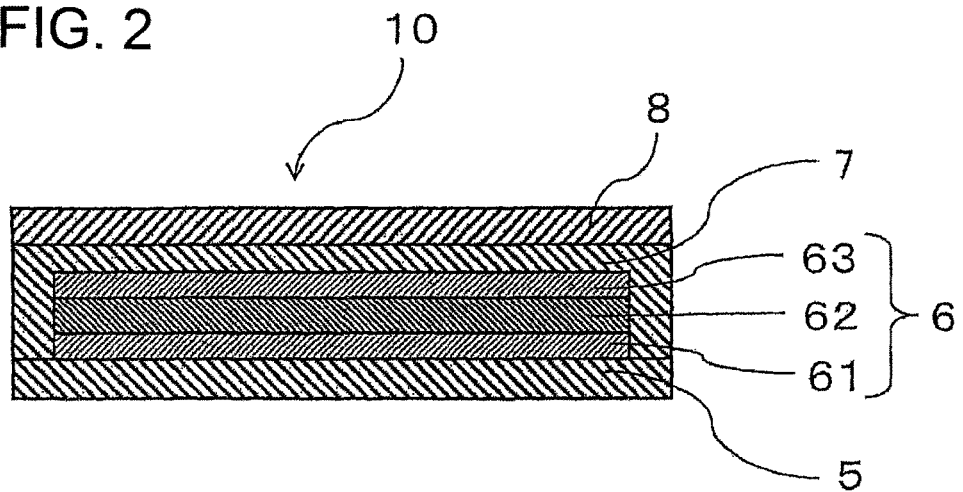
FIG. 2 is a cross-sectional view schematically illustrating the structure of an image display device which uses a resin sheet for element encapsulation for organic electronic devices related to the embodiment of the present invention.

The organic EL element 6 includes, for example, as illustrated in FIG. 2, an anode 61 formed by patterning a conductive material, an organic layer 62 formed by a thin film of an organic compound material and laminated on the surface of the anode 61, and a cathode 63 laminated on the surface of the organic layer 62 and formed by patterning a transparent conductive material, on an element substrate 5 formed from a glass substrate or the like. Meanwhile, parts of the anode 61 and the cathode 63 protrude from an edge of the element substrate 5 and are connected to a driving circuit that is not illustrated in the diagram. The organic layer 62 is formed by laminating a hole injection layer, a hole transport layer, a light emitting layer, and an electron transport layer in this order from the anode 61 side, and the light emitting layer is formed by laminating a blue light emitting layer, a green light emitting layer, and a red light emitting layer. Meanwhile, the light emitting layer may also have non-luminescent intermediate layers between the various light emitting layers of blue, green and red colors. Furthermore, after the organic layer 62 and the cathode 63 are formed, when organic and inorganic thin films having gas barrier properties are formed so as to cover these organic layer and cathode, it is more effective for preventing deterioration of the organic light emitting device, together with the effect of the transparent resin layer for organic EL element encapsulation 7.

Incidentally, in this organic EL display 10, the sealed lateral surface is exposed, and a further tight sealing treatment with glass frit or the like is not performed. Since the resin composition for element encapsulation for organic electronic devices according to the present invention has both high water vapor barrier properties and adhesiveness, it is not necessary to carry out a further tight sealing treatment based on glass frit or the like as such, the structure of the organic electronic device is simplified, and the cost can be decreased.

For the sealing substrate 8, any material having properties that do not significantly inhibit visibility of the contents displayed by the organic EL display 10, may be used, and for example, glass or a resin can be used.

Figure 3A:
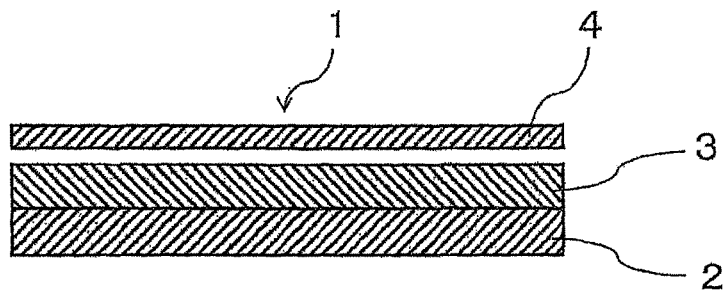
FIGS. 3A~3D are explanatory diagrams for schematically describing the use of a resin sheet for element encapsulation for organic electronic devices related to the embodiment of the present invention.
Figure 3B:
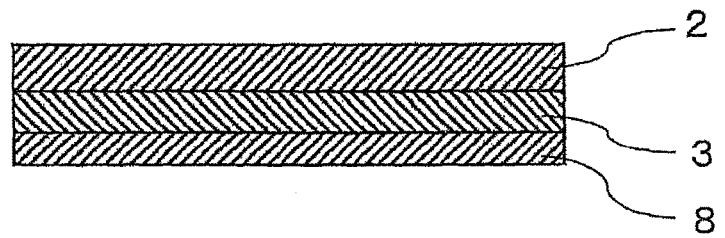
Figure 3C:
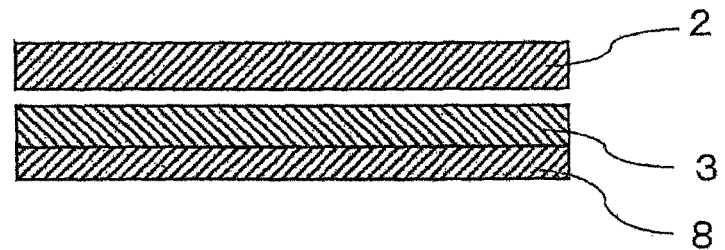
Figure 3D:
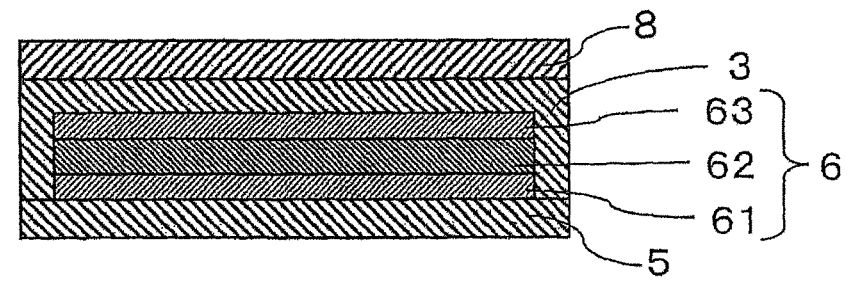

The transparent resin layer for organic EL element encapsulation 7 is formed using the resin sheet for element encapsulation for organic electronic devices 1 described above, and the resin layer can be formed by the following procedure. First, as illustrated in FIG. 3A, the release film 4 of the resin sheet for element encapsulation for organic electronic devices 1 is peeled off, and as illustrated in FIG. 3B, the sealing layer 3 is roll-pasted to the sealing substrate 8. Next, as illustrated in FIG. 3C, the substrate sheet 2 of the resin sheet for element encapsulation for organic electronic devices 1 pasted to the sealing substrate 8 is peeled off. Thereafter, as illustrated in FIG. 3D, the sealing layer 3 of the resin sheet for element encapsulation for organic electronic devices 1 pasted to the sealing substrate 8 is laminated on the cathode 63 side of the organic EL element 6. The sealing layer 3 of the resin sheet for element encapsulation for organic electronic devices 1 constitutes the transparent resin layer for organic EL element encapsulation 7 in the organic EL display 10.

It is preferable that the pasting and lamination described above are carried out at a temperature of 100° C. or lower. If the temperature exceeds 100° C., the constituent materials of the organic EL element 6 are deteriorated, and there is a risk that the light emission characteristics may be deteriorated.

Incidentally, in the step for forming the transparent resin layer for organic EL element encapsulation 7 described above, the resin sheet for element encapsulation for organic electronic devices 1 is initially roll-pasted to the sealing substrate 8; however, it is also acceptable to paste the resin sheet to the organic EL element 6. In this case, the substrate sheet 2 of the resin sheet for element encapsulation for organic electronic devices 1 is peeled off, and then the sealing layer 3 is laminated onto the sealing substrate 8.

Furthermore, a gas barrier film may be interposed between the sealing layer 3 and the sealing substrate 8, and a resin sheet for element encapsulation for organic electronic devices 1 having a gas barrier film laminated in advance on the surface on the opposite side of the substrate sheet 2 of the sealing layer 3, may also be used. In the case of using the resin sheet for element encapsulation for organic electronic devices 1 having a gas barrier film laminated in advance on the surface on the opposite side of the substrate sheet 2 of the sealing layer 3, a gas barrier film- and sealing layer 3-attached organic EL element is produced by peeling off the substrate sheet 2, and then pasting the sealing layer 3 to the organic EL element 6.

Further, in the case of using the resin sheet for element encapsulation for organic electronic devices 1 in which the sealing substrate is laminated in advance on the surface opposite to the substrate sheet 2 of the sealing layer 3, it is not necessary to roll-paste the resin sheet to the sealing substrate 8 as described above, the substrate sheet 2 of the resin sheet for element encapsulation for organic electronic devices 1 pasted with the sealing substrate in advance may be peeled off, and then the exposed sealing layer 3 may be laminated onto the cathode 63 side of the organic EL element 6.

Hereinafter, the configuration of the present invention is described in more detail by way of Examples, but the present invention is not intended to be limited to these.

Example 1

20 parts by mass of Kraton G-1652 (manufactured by Kraton Performance Polymers, Inc., hydride of styrene-butadiene-styrene block copolymer: SEBS, mass average molecular weight: 79,000, content of styrene: 30%, degree of hydrogenation: 90% or more) as a diene polymer was dissolved in toluene with stirring by adjusting the concentration to a solid content of 20% by mass. Thereafter, 65 parts by mass of I-MARV P100 (manufactured by Idemitsu Kosan Co., Ltd., hydrogenated dicyclopentadiene/aromatic copolymer-based petroleum resin) as a hydrogenated cyclic olefin compound and 15 parts by mass of PARLEAM 24 (manufactured by NOF CORPORATION, hydrogenated polybutene, number average molecular weight: 1,350) as a softening agent were added thereto, and then the concentration was adjusted with toluene to a solid content of 30% by mass. The mixture was mixed and stirred until a uniform state was obtained, and thus a resin mixed solution was obtained.

On the releasable surface of a release-treated polyester film (manufactured by Teijin DuPont Films, Ltd., PUREX A-314) having a thickness of 50 μm as a substrate sheet, the resin mixed solution obtained as described above was applied to obtain a thickness after drying of 20 μm, and then the resin mixed solution was heated and dried at 130° C. for 3 minutes. Thus, a sealing layer was formed. The sealing layer surface after drying was laminated on the releasable surface a release-treated polyester film (manufactured by Toyobo Co., Ltd., TOYOBO ESTER FILM E7006) having a thickness of 25 μm as a release film, and thus a transparent resin sheet for organic EL element encapsulation having a uniform thickness and related to Example 1 was produced.

Examples 2 to 20

Transparent resin sheet for organic EL element encapsulation related to Examples 2 to 20 were produced in the same manner as in Example 1, except that the blend compositions indicated in Tables 1 and 2 were used.

Comparative Examples 1 to 9

Transparent resin sheet for organic EL element encapsulation related to Comparative Examples 1 to 9 were produced in the same manner as in Example 1, except that the blend compositions indicated in Table 3 were used.

(Raw Materials)

<Diene Polymer>

A1: Kraton G-1652 (manufactured by Kraton Performance Polymers, Inc., hydride of styrene-butadiene-styrene block copolymer: SEBS, mass average molecular weight: 79,000, content of styrene: 30%, degree of hydrogenation: 90% or more)

A2: SEPTON 52005 (manufactured by Kuraray Co., Ltd., hydride of styrene-isoprene-styrene block copolymer: SEPS, mass average molecular weight: 250,000, content of styrene: 20%, degree of hydrogenation: 90% or more)

A3: ASAPRENE T-430 (manufactured by Asahi Kasei Chemicals Corp., styrene-butadiene-styrene block copolymer: SBS, mass average molecular weight: 210,000, content of styrene: 30%)

A4: Quintac 3433N (manufactured by Zeon Corp., styrene-isoprene-styrene block copolymer: SIS, mass average molecular weight: 171,000, content of styrene: 16%)

<Hydrogenated Cyclic Olefin Compound>

B1: I-MARV P100 (manufactured by Idemitsu Kosan Co., Ltd., hydrogenated dicyclopentadiene/aromatic copolymer-based petroleum resin)

B2: Escorez 5300 (manufactured by Tonex Co., Ltd., hydrogenated dicyclopentadiene-based petroleum resin)

B3: ZEONEX 480 (manufactured by Zeon Corp., cycloolefin polymer: COP)

<Softening Agent>

C1: PARLEAM 24 (manufactured by NOF CORPORATION, hydrogenated polybutene, number average molecular weight: 1,350)

C2: Nissan polybutene 200N (manufactured by NOF CORPORATION, polybutene, number average molecular weight: 2,650)

C3: Nissan polybutene 3N (manufactured by NOF CORPORATION, polybutene, number average molecular weight: 720)

C4: Nissan polybutene ON (manufactured by NOF CORPORATION, polybutene, number average molecular weight: 370)

C5: Kuraprene LIR200 (manufactured by Kuraray Co., Ltd., hydrogenated liquid isoprene resin, number average molecular weight: 25,000, degree of hydrogenation: 90% or more)

C6: MORESCO-WHITE P-200 (manufactured by MORESCO Corporation, liquid paraffin, number average molecular weight: 400)

C7: RICON 153 (manufactured by Cray Valley USA, LLC, liquid polybutadiene, number average molecular weight: 4,700)

<Desiccant>

D1: Aluminum trisethyl acetoacetate ALCH-TR (manufactured by Kawaken Fine Chemicals Co., Ltd.: compound represented by the following formula (Chemical Formula 4), molecular weight: 414)

[Chemical Formula 4]

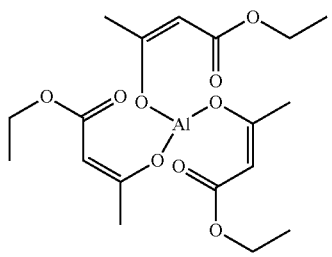

(Evaluation Methods)

Evaluations were carried out according to the following evaluation methods. The results are presented in Table 1 and Table 2.

<Light Transmittance>

The light transmittance of the resin composition for element encapsulation for organic electronic devices was obtained by a transparent mode using a spectrophotometer (Spectrometer "V-670" manufactured by JASCO Corporation). Specifically, the sealing layer was pasted and adjusted at 80° C. until having a thickness of 0.1 mm, thereby preparing a specimen. The measurement was carried out in the range of a wavelength region of 220 nm to 2200 nm at 25° C., a data interval of 1 nm, a UV/VIS bandwidth of 5 nm, and a scanning speed of 1000 nm/min. The transmittance per 1 nm obtained by the measurement was averaged in a wavelength region of 400 nm to 800 nm and the obtained average value was designated as the light transmittance. On the occasion of the measurement, baseline/dark correction was carried out. Switching of light sources was set to 340 nm, switching of diffraction grating was set to 850 nm, and filter replacement was carried out in a stepwise manner.

<Moisture Permeability>

The release-treated polyester film having a thickness of 25 μm and the release-treated polyester film having a thickness of 50 μm of the adjusted transparent resin sheet for organic EL element encapsulation were peeled off and attached between a low-humidity chamber and a high-humidity chamber while wrinkle or slackness is not produced. The moisture permeability at 40° C. and 90% RH was obtained according to JIS K7129C using a differential pressure type gas-water vapor permeability measurement apparatus (manufactured by GTR Tec Corporation, GTR-10XAWT) and gas chromatography (manufactured by Yanaco New Science Inc., G2700T). In Comparative Examples 5 and 6, since the transparent resin compositions for encapsulation could not be attached alone, a filter paper was used as a support and the moisture permeability was measured. Then, the extent of contribution of the filter paper was subtracted after the measurement, thereby obtaining the moisture permeability.

<Adhesive Force>

The release-treated polyester film having a thickness of 25 μm of the adjusted transparent resin sheet for organic EL element encapsulation was peeled off, and an easy adhesion-treated polyester film (manufactured by Teij in-DuPont Film, Ltd., G2-C) having a thickness of 38 μm was pasted thereon at 80° C. Subsequently, the release-treated polyester film having a thickness of 50 μm was peeled off, and the resultant was used as a specimen. On the surface of the sealing layer of the specimen thus obtained, a float plate glass according to JIS R3202 as an adherend was pasted at 80° C., and the specimen was peeled off from the adherend by the 180° peel test according to JIS 20237 to thereby evaluate the adhesive force.

<Dark Spot>

An organic EL element having an anode on an element substrate formed from insulating transparent glass, and having an organic layer on the upper surface of the anode and a cathode on the upper surface of the organic layer, was produced. Subsequently, the release-treated polyester film having a thickness of 25 μm of the adjusted transparent resin sheet for organic EL element encapsulation was peeled off, and the transparent resin sheet was disposed on the surface of the cathode of the organic EL element. Thereafter, the release-treated polyester film having a thickness of 50 μm of the transparent resin sheet for organic EL element encapsulation was peeled off, and the insulating transparent glass as a sealing substrate was disposed on the surface of the sealing layer of the transparent resin sheet for organic EL element encapsulation. The assembly was pressed for one minute at a pressure of 0.6 MPa at 80° C. under reduced pressure. Thus, a model of an organic EL display was produced.

Next, the model was treated at 80° C. and 85% RH for 500 hours. Thereafter, the model was cooled to room temperature (25° C.), subsequently the organic EL element was operated, and dark spots (non-luminescent sites) were observed. A case in which the area of dark spots was less than 1% of the total area was rated as "⊙" for having a particularly excellent ability to suppress the generation of dark spots, a case in which the area of dark spots was less than 5% was rated as "○" for having an excellent ability to suppress the generation of dark spots, and a case in which the area of dark spots was 5% or more was rated as "X" for having a poor ability to suppress the generation of dark spots.

<Amount of Extrusion>

The sealing layer was pasted at 80° C. until having a thickness of 0.1 mm and adjusted to have a size of 10 mm×10 mm, thereby preparing a specimen. Incidentally, the specimen was prepared within tolerances of ±5 μm film thickness and ±0.5 mm size. UPILEX film (manufactured by UBE INDUSTRIES, LTD., polyimide film) having a size of 10 mm×10 mm×50 μm thick, was superimposed on the adjusted specimen, the resultant was disposed between two float plate glasses in conformity to JIS R 3202 and the assembly was pressed for 1 minute at a pressure of 0.6 MPa at 80° C.

Subsequently, the extrusion of the sealing layer from the UPILEX film described above was observed with an optical microscope, and the maximum value of the length of the sealing layer extruding from each side of the UPILEX film in a direction perpendicular to each side of the UPILEX film, was designated as the amount of extrusion. A case in which the amount of extrusion was less than 500 μm was rated as "⊙" for having a particularly excellent ability to suppress the amount of extrusion, a case in which the amount of extrusion was less than 1,000 μm was rated as "○" for having an excellent ability to suppress the amount of extrusion, and a case in which the amount of extrusion was 1,000 μm or more was rated as "X" for having a poor ability to suppress the amount of extrusion.

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Diene-based polymer [parts by mass] | A1 | 20 | 10 | 45 | 20 | 20 | 20 | 20 | 20 | 20 | 10 |
|  | A2 |  |  |  |  |  |  |  |  |  |  |
|  | A3 |  |  |  |  |  |  |  |  |  |  |
|  | A4 |  |  |  |  |  |  |  |  |  |  |
| Hydrogenated cyclic olefin compound [parts by mass] | B1 | 65 | 75 | 40 | 65 | 65 | 65 | 65 | 65 | 65 | 60 |
|  | B2 |  |  |  |  |  |  |  |  |  |  |
|  | B3 |  |  |  |  |  |  |  |  |  |  |
| Softening agent [parts by mass] | C1 | 15 | 15 | 15 |  |  |  |  |  |  |  |
|  | C2 |  |  |  | 15 |  |  |  |  |  |  |
|  | C3 |  |  |  |  | 15 |  |  |  |  | 30 |
|  | C4 |  |  |  |  |  | 15 |  |  |  |  |
|  | C5 |  |  |  |  |  |  | 15 |  |  |  |
|  | C6 |  |  |  |  |  |  |  | 15 |  |  |
|  | C7 |  |  |  |  |  |  |  |  | 15 |  |
| Desiccant [parts by mass] | D1 |  |  |  |  |  |  |  |  |  |  |
| Light transmittance [%] |  | 92 | 92 | 90 | 92 | 91 | 92 | 90 | 90 | 91 | 91 |
| Moisture permeability at 40° C. 90% [g/m² · day] |  | 11.5 | 5.7 | 21.7 | 11.8 | 12.1 | 13.7 | 28.4 | 36.7 | 38.2 | 28.9 |
| Adhesive force relative to glass [N/25 mm] |  | 20.6 | 11.2 | 20.5 | 21.7 | 22.7 | 28.5 | 10.7 | 13.9 | 12.3 | 29.1 |
| Dark spots |  | ⊙ | ⊙ | ⊙ | ⊙ | ⊙ | ⊙ | ○ | ○ | ○ | ⊙ |
| Amount of extrusion |  | ⊙ | ⊙ | ⊙ | ⊙ | ⊙ | ⊙ | ⊙ | ⊙ | ⊙ | ⊙ |

TABLE 2

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Diene-based polymer [parts by mass] | A1 | 25 | 20 | 20 |  |  |  | 20 | 70 | 70 | 70 |
|  | A2 |  |  |  | 20 |  |  |  |  |  |  |
|  | A3 |  |  |  |  | 20 |  |  |  |  |  |
|  | A4 |  |  |  |  |  | 20 |  |  |  |  |
| Hydrogenated cyclic olefin compound [parts by mass] | B1 | 70 |  |  | 65 | 65 | 65 | 62 |  |  |  |
|  | B2 |  | 65 |  |  |  |  |  |  |  |  |
|  | B3 |  |  | 50 |  |  |  |  |  |  |  |
| Softening agent [parts by mass] | C1 |  |  |  |  |  |  |  | 30 |  |  |
|  | C2 |  |  |  |  |  |  |  |  | 30 |  |
|  | C3 | 5 | 15 | 30 | 15 | 15 | 15 | 15 |  |  | 30 |
|  | C4 |  |  |  |  |  |  |  |  |  |  |
|  | C5 |  |  |  |  |  |  |  |  |  |  |
|  | C6 |  |  |  |  |  |  |  |  |  |  |
|  | C7 |  |  |  |  |  |  |  |  |  |  |
| Desiccant [parts by mass] | D1 |  |  |  |  |  |  | 3 |  |  |  |
| Light transmittance [%] |  | 92 | 90 | 92 | 92 | 89 | 89 | 90 | 92 | 92 | 91 |
| Moisture permeability at 40° C. 90% [g/m² · day] |  | 6.6 | 14.2 | 4.6 | 14.8 | 23.4 | 22.6 | 5.5 | 48.6 | 40.2 | 41.1 |
| Adhesive force relative to glass [N/25 mm] |  | 23.5 | 23.4 | 10.9 | 18.0 | 19.2 | 17.3 | 21.8 | 10.7 | 10.1 | 10.7 |
| Dark spots |  | ⊙ | ⊙ | ⊙ | ⊙ | ⊙ | ⊙ | ⊙ | ○ | ○ | ○ |
| Amount of extrusion |  | ⊙ | ⊙ | ⊙ | ⊙ | ⊙ | ⊙ | ⊙ | ○ | ○ | ○ |

TABLE 3

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|
| Diene-based polymer [parts by mass] | A1 | 100 | 96 | 35 | 31 | 65 | 55 | 50 | 20 | 32 |
|  | A2 |  |  |  |  |  |  |  |  |  |
|  | A3 |  |  |  |  |  |  |  |  |  |
|  | A4 |  |  |  |  |  |  |  |  |  |
| Hydrogenated cyclic olefin compound [parts by mass] | B1 |  |  |  | 65 | 65 |  | 10 |  | 10 | 65 |
|  | B2 |  |  |  |  |  |  |  |  |  |
|  | B3 |  |  |  |  |  |  |  |  |  |

TABLE 3-continued

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|
| Softening agent [parts by mass] | C1 |  | 4 |  | 4 | 35 | 35 | 50 | 50 |  |
|  | C2 |  |  |  |  |  |  |  |  |  |
|  | C3 |  |  |  |  |  |  |  |  |  |
|  | C4 |  |  |  |  |  |  |  |  |  |
|  | C5 |  |  |  |  |  |  |  |  |  |
|  | C6 |  |  |  |  |  |  |  |  |  |
| Desiccant [parts by mass] | D1 |  |  |  |  |  |  |  |  | 3 |
| Light transmittance [%] |  | 90 | 91 | 91 | 91 | 89 | 89 | 89 | 89 | 91 |
| Moisture permeability at 40° C. 90% [g/m² · day] |  | 40.2 | 43.2 | 17.6 | 15.4 | 62.2 | 54.8 | 231.1 | 84.9 | 13.5 |
| Adhesive force relative to glass [N/25 mm] |  | 8.8 | 9.0 | 5.1 | 9.8 | 8.9 | 9.7 | 0.3 | 1.2 | 4.5 |
| Dark spots |  | X | X | X | X | X | X | X | X | X |
| Amount of extrusion |  | ○ | ○ | ⊙ | ⊙ | X | X | X | X | ⊙ |

As shown in Table 1 and Table 2, since Examples 1 to 20 contained a diene polymer and a softening agent and the content of the softening agent was from 5% by mass to 30% by mass of the total mass, satisfactory results were obtained in the evaluation of dark spots. Particularly, since Examples 1 to 6 and 10 to 17 used polybutene as a softening agent and further contained a hydrogenated cyclic olefin compound, dark spots were suppressed to less than 1% and the amount of extrusion was also less than 500 μm, which were particularly excellent results. In addition, since Examples 7 to 9 contained a hydrogenated cyclic olefin compound, dark spots were suppressed to less than 5% and the amount of extrusion was also less than 500 μm, which were excellent results. Since, in Examples 18 to 20, the content of the softening agent was from 5% by mass to 30% by mass of the total mass, satisfactory results were obtained in the evaluation of dark spots.

On the contrary, since, in Comparative Examples 1 to 4 and 9, the content of the softening agent was less than 5% by mass, the adhesive force was small and the moisture infiltrated from the interface between the sealing material and the glass substrate. Accordingly, dark spots were generated. Since Comparative Examples 5 to 8 contained 30% by mass or more of the softening agent, the moisture permeability was significantly large and the adhesive force was less than 10 N/25 mm. Accordingly, a large quantity of moisture entered from the outside and thus dark spots were generated.

EXPLANATIONS OF LETTERS OR NUMERALS

1: RESIN SHEET FOR ELEMENT ENCAPSULATION FOR ORGANIC ELECTRONIC DEVICES
2: SUBSTRATE SHEET
3: SEALING LAYER
4: RELEASE FILM
5: ELEMENT SUBSTRATE
6: ORGANIC EL ELEMENT
10: ORGANIC EL DISPLAY
61: ANODE
62: ORGANIC LAYER
63: CATHODE
7: TRANSPARENT RESIN LAYER FOR ORGANIC EL ELEMENT ENCAPSULATION
8: SEALING SUBSTRATE

The invention claimed is:

1. An adhesive resin composition comprising:
a diene polymer,
a hydrogenated cyclic olefin compound, and
a softening agent,
wherein:
a content of the softening agent is from 5% by mass to 30% by mass of the total mass of the resin composition,
a content of the hydrogenated cyclic olefin compound is from 50% by mass to 75% by mass of the total mass of the resin composition,
the softening agent comprises a saturated hydrocarbon at a ratio of 80% or more of a repeating unit of the softening agent structure and a number average molecular weight of the softening agent is from 300 to 3,000,
the diene polymer is at least one selected from styrene-butadiene copolymers and hydrides thereof, styrene-isoprene copolymers and hydrides thereof, styrene-butadiene-styrene block copolymers and hydrides thereof, and styrene-isoprene-styrene block copolymers and hydrides thereof, and
wherein an average value of light transmittance of said adhesive resin composition in a wavelength region of 400 nm to 800 nm at a thickness of 0.1 mm is 85% or more.

2. The resin composition according to claim 1, wherein the compound containing a saturated hydrocarbon at a ratio of 80% or more in a repeating unit is a compound containing an isobutylene skeleton as a main component.

3. The resin composition according to claim 2, wherein the compound containing an isobutylene skeleton as a main component is polybutene.

4. The resin composition according to claim 1, wherein the hydrogenated cyclic olefin compound is a hydrogenated petroleum resin.

5. The resin composition according to claim 4, wherein the hydrogenated petroleum resin includes a dicyclopentadiene structure.

6. The resin composition to claim 1, wherein the diene polymer is at least one selected from styrene-butadiene-styrene block copolymers and hydrides thereof, and styrene-isoprene-styrene block copolymers and hydrides thereof.

7. The resin composition according to claim 1, wherein a content of the diene polymer is from 10 to 35% by mass of the total mass of the resin composition.

8. The resin composition according to claim 1, wherein all of the diene polymer, the cyclic olefin compound, and the softening agent are hydrogenated.

9. The resin composition according to claim 1, further comprising a desiccant.

10. A resin sheet comprising at least a sealing layer formed by the resin composition according to claim 1.

11. An organic electroluminescent element sealed by the resin composition according to claim 1.

12. An image display device comprising the organic electroluminescent element according to claim 11.

13. The resin composition according to claim 1, wherein:
the diene polymer is at least one selected from styrene-butadiene-styrene block copolymers and hydrides thereof, and styrene-isoprene-styrene block copolymers and hydrides thereof;
the hydrogenated cyclic olefin compound comprises a dicyclopentadiene structure; and
the softening agent is polybutene.

14. The resin composition according to claim 13, wherein a content of the diene polymer is from 10 to 35% by mass of the total mass of the resin composition.

15. The resin composition according to claim 1, wherein the average value of light transmittance of said adhesive resin composition in a wavelength region of 400 nm to 800 nm at a thickness of 0.1 mm is 85%-92%.

16. The resin composition according to claim 1, wherein the diene polymer is at least one selected from styrene-butadiene copolymers and hydrides thereof, styrene-isoprene copolymers and hydrides thereof, styrene-butadiene-styrene block copolymers and hydrides thereof, and styrene-isoprene-styrene block copolymers and hydrides thereof.

17. The resin composition according to claim 1, wherein the diene polymer is at least one selected from styrene-butadiene copolymers and hydrides thereof, and styrene-isoprene copolymers and hydrides thereof.

* * * * *